United States Patent [19]

Kaylor et al.

[11] Patent Number: 4,929,960
[45] Date of Patent: May 29, 1990

[54] PEAK RADIATED ENERGY LOCATOR

[75] Inventors: William R. Kaylor, Morristown; Frederick A. Fisher, Jefferson City, both of Tenn.

[73] Assignee: North American Philips Corporation, New York, N.Y.

[21] Appl. No.: 323,474

[22] Filed: Mar. 14, 1989

[51] Int. Cl.$^5$ ............................................. G01R 23/18
[52] U.S. Cl. ..................................... 343/703; 343/853; 343/719
[58] Field of Search ....................... 343/703, 853, 719; 324/77 B

[56] References Cited

U.S. PATENT DOCUMENTS 3,153,760 10/1964 Henderson ........................... 343/703
3,302,205 1/1967 Johnson ................................ 343/703
4,754,496 6/1988 Fishkin et al. ....................... 343/703

Primary Examiner—Rolf Hille
Assistant Examiner—Hoanganh Le

[57] ABSTRACT

A peak radiated energy locator includes a plurality of broadband antennas mounted on a mast positioned between the radiating device and a calibrated antenna located to receive the radiated energy. The vertical angle at which peak radiated energy occurs is determined by establishing the broadband antenna receiving energy at a level that exceeds the levels of all the other broadband antennas and providing the vertical angle corresponding to the height of that antenna. The mast and broadband antennas are then removed, the calibrated antenna is positioned at a height corresponding to the determined vertical angle and an accurate measurement of the peak radiated energy is made.

14 Claims, 3 Drawing Sheets

PEAK RADIATED ENERGY LOCATOR

BACKGROUND OF THE INVENTION

1. Field of the Invention

The invention pertains to the field of radiation detection and more particularly to the measurement of energy leakage from an electrical/electronic device and the determination of the spherical position of the peak energy radiated energy lobes.

2. Description of the Prior Art

Determination of the level and location of the peak energy leakage from an electrical/electronic device requires detection of low level signals in the vicinitY of the device under test (DUT). These measurements are generally performed by placing the DUT one meter above a ground plane on a rotatable platform for rotation through 360°. An antenna of a calibrated receiving system, height adjustable from one to four meters above the ground plane, is positioned at a fixed distance from the DUT that is 3 meters from the edges of the DUT. Measurements through 360° rotation are performed with the antenna positioned at a multiplicity of heights within the 1-4 meter range, one height for each 360° rotation. The data so accumulated is analyzed to determine the peak RF energy emanating locations from the DUT and the elevation angles of these peak radiations. Such a procedure is tedious, requiring many repetitive measurements to establish the maximum RF emanation area and peak radiation angle, with a high probabilitY that the true parameters have been determined. To compound the difficulty these measurements must be made over a 30 MHz to 1000 MHz frequency band.

SUMMARY OF THE INVENTION

In accordance with the principles of the present invention a multiplicity of broadband, cross polarized, wide beam angle sense antennas are located on a mast constructed of a non-conducting material. The mast extends vertically and is positioned about midwaY between the DUT and the antennas of the calibrated receiving system. Initial RF field measurements are made utilizing the sense antennas and the rotation of the DUT through 360° to determine the peak emanations from the DUT, their spherical locations, and their cross polarization components. After this initial determination has been made, the mast is lowered below the ground plane to remove it from the test range, the DUT is rotated to position the located peak emanation area towards the antenna of the calibrated system, the antenna of the calibrated system is raised to the height corresponding to the peak elevation angle of the radiation as determined by the initial measurements, and the measurements are performed with the calibrated system to establish the calibrated level of the peak emanations from the DUT and the true spherical location of the peak radiation. When determining the calibrated levels of the emanations the antenna of the calibrated sYstem maY be rotated to be polarized at the polarization angle determined from the cross polarization components provided by the sense antennas. In this manner the antenna of the calibrated sYstem maY be positioned to provide a true indication of the peak radiated energy.

DESCRIPTION OF THE PREFERRED EMBODIMENTS

Figure 1:
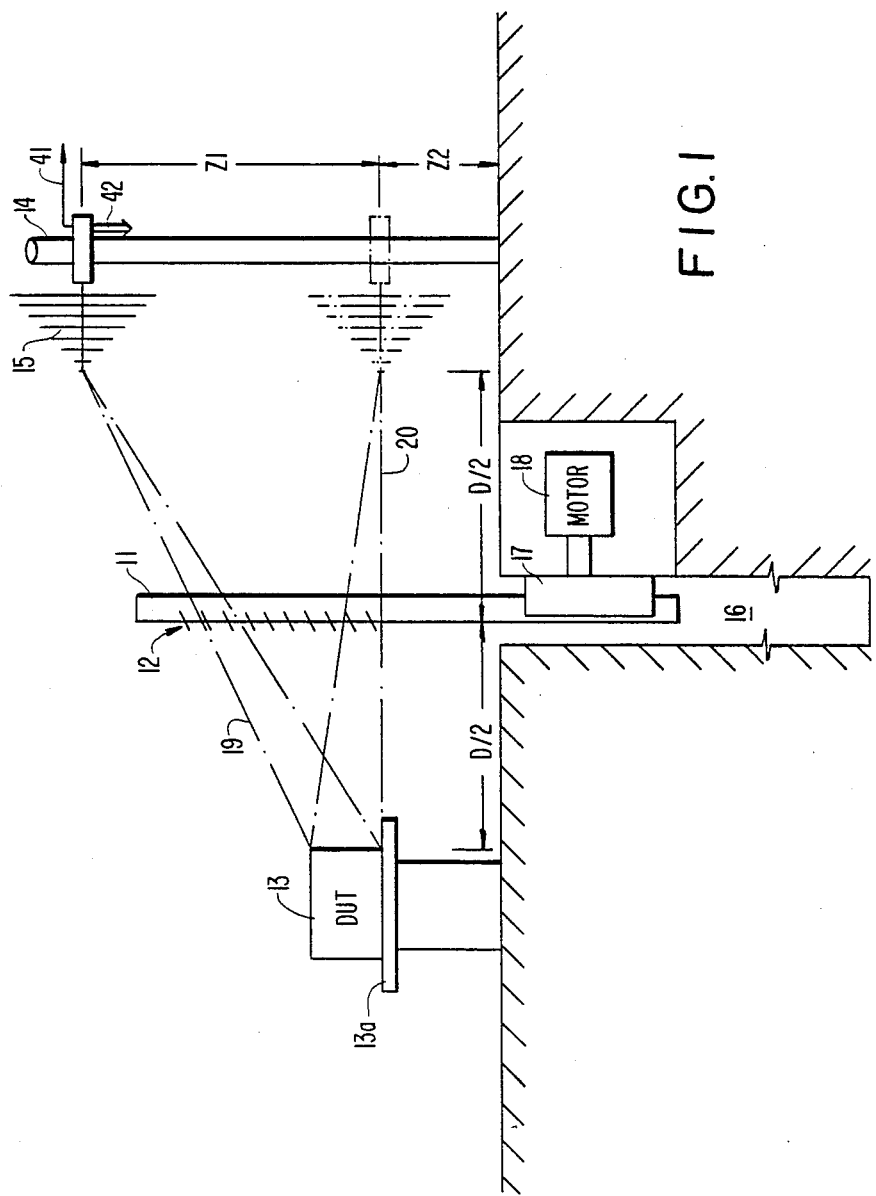
FIG. 1 is a schematic diagram of a peak radiation energy locator range configured in accordance with the present invention.

A test range in accordance with the invention is shown in FIG. 1. A mast 11, on which a plurality of sense antennas 12 are mounted, is located between the DUT 13, positioned on a turntable 13a, and a second mast 14 on which a gain calibrated antenna 15 is mounted in a manner to permit antenna height adjustments over a range, from one Z1 to Z2 meters above the ground. In this particular embodiment Z1 equals 3 meters and Z2 equals 1 meter so the antenna 15 height can be adjusted from 1 to 4 meters. The masts 11 and 14 are positioned to provide a horizontal distance of 3 meters between the calibrated antenna 15 and the DUT 13 and to locate the sense antennas 12 midway between the DUT 13 and the calibrated antenna 15. In a standard range the distance D between the calibrated antenna 15 and the DUT 13 is 3 meters, thus as configured for use on a standard range the mast 11 is positioned to locate the sense antennas at a distance D/2 or 1.5 meters from the DUT.

Mast 11 may be elevated to raise the sense antennas 12 into the regions of possible radiation, for the initial measurements, and lowered into a storage chamber 16, after the initial measurements are completed, by a height positioning mechanism 17 driven by a motor 18. The region of possible radiation from the DUT 13 for the arrangement shown in FIG. 1 is the area between the lines 19 and 20. When the initial radiation leakage measurements, Yet to be described, are completed the mast 11 is lowered into the storage chamber 16, leaving an unobstructed measurement range for the final determination of the peak emanation level, the elevation angle of the peak emanation, and the area of the leakage area of the DUT.

Figure 2:
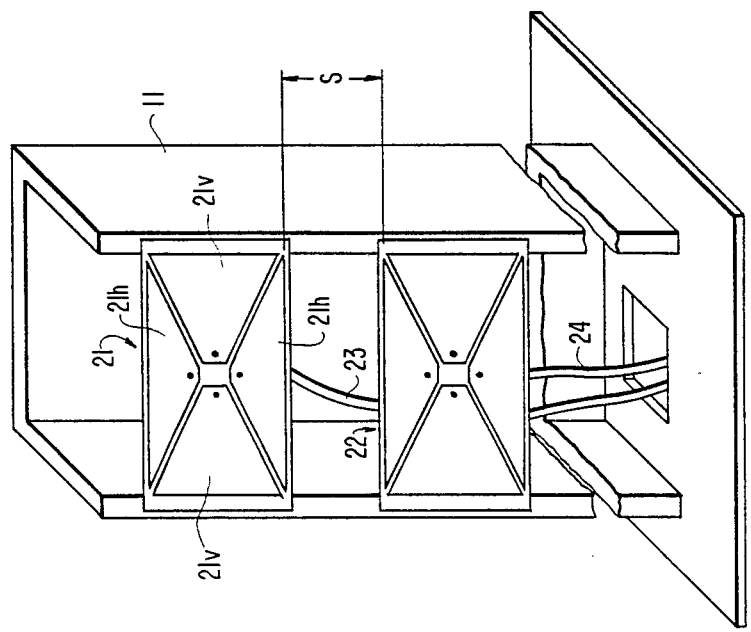
FIG. 2 is a pictorial representation of a mast having sense antennas mounted thereon that may be used in the range of FIG. 1.

Two sense antennas 21, 22 of plurality of sense antennas on the mast 11, which may number twenty or more, are shown in FIG. 2. These sense antennas may comprise cross polarized small non-resonant, butterfly elements, such as 21h and 21v to provide dual polarized, broadband, and broadbeam performance. Coaxial cables 23 and 24, respectively, couple signals from the sense antennas 21 and 22 to a processing unit, to be described with reference to FIG. 3, wherein the elevation angle of the horizontal and vertical polarization peak radiated signal and the polarization at which the maximum radiation is detected may be determined. The sense antennas, as represented by sense antennas 21, 22 are separated by a distance s which is chosen to minimize the cross coupling between the sense antennas, so that the energy received in each sense antenna does not include energy coupled from other sense antennas mounted on the mast 11.

Due to manufacturing tolerances and other factors, the sense antennas do not all have the same gain characteristics. In order to obtain a normalizing factor and establish a common reference, the DUT 13 is taken from the turn table 13a and replaced with a source that is omnidirectional in the vertical plane. Radiation from this source is detected at the output terminals of each of the sense antennas and the relative levels stored in a computer table to provide normalizing factors to the detected radiation from the DUT.

Figure 3:
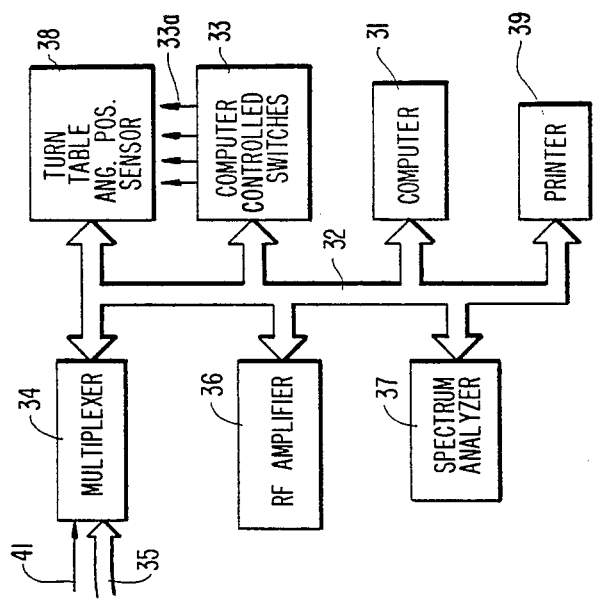
FIG. 3 is a block diagram of a preferred measurement and control system for the range of FIG. 1.

After the sense antenna calibration, the DUT 13 is replaced and the initial measurements are taken. Refer now to FIG. 3 wherein a block diagram of the measurement control system is shoWn. A computer 31, wherein the normalization factors previously described are stored, controls the sequence of events that form the measurement process. Commands for the computer 31 are sent via bus 32 to switches 33 which provides signals via lines 33a that control the movement of the sense antenna mast 11, the rotation of the turn table 13a, the position of the calibrated antenna 15, and the polarization of the calibrated antenna.

Each of the sense antennas is coupled via coaxial cables 35 to a multiplexer 34 which is controlled by computer 31 via bus 32. Multiplexer 34 rapidly and sequentially samples the vertically and horizontally polarized butterfly elements of each sense antenna and serially couples the samples to an RF amplifier 36, wherefrom the serially positioned amplified signals are coupled to a tunable calibrated receiver 37, such as a spectrum analyzer. The entire operation is controlled by the computer 31. This unit sets the frequency of the spectrum analyzer 37 and sends requests to the spectrum analyzer for signal amplitude reports. After a request for a signal amplitude report is received, the spectrum analyzer sends data to the computer 31 that is representative of detected signal amplitudes.

An angle position sensor 38, coupled to the turn table 13a, couples signals to the computer 31 via bus 32 that are representative of the angular position of the turn table 13a at each instant. Since the sense antennas are sampled bY the multiplexer 34 at a rate that is much greater than the turning rate of the turn table 13a, all signals from the sense antennas in one sample cYcle are due to emanations at one angular position of the turn table 13a. The angular positions and corresponding signal amplitudes at each frequency from all sense antennas are coupled to the computer 31 for storage therein and subsequent comparison.

Figure 4:
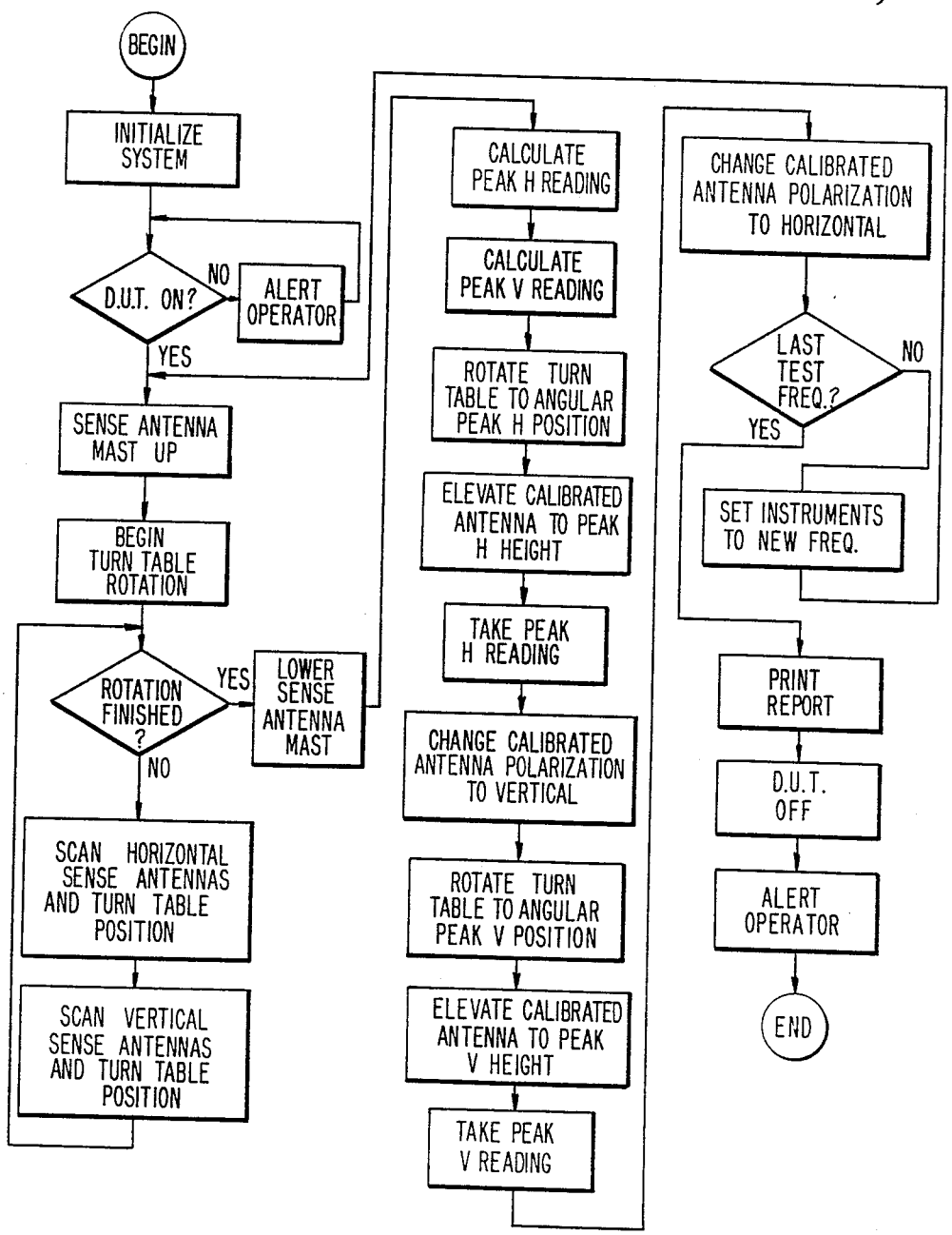
FIG. 4 is a program flow chart for the computer of FIG. 3.

Referring now to FIGS. 1 and 3, when the data is complete, the computer 31 commands the control switches 33 to lower the mast 11 into the storage chamber 16. At this time the computer calculates the peak emanations for horizontal and vertical polarizations at each measurement frequencY. After these calculations have been performed, the computer sends a command via the control switches 33 to rotate the turn table 13a to the angular position of a peak emanation for a chosen frequencY. A command is then sent via control switches 33 and lines 42 (FIG. 1) to rotate the calibrated antenna to be horizontally polarized and to locate it at the height computed for reception of that peak emanation. Signals from the DUT 13 are received bY the calibrated antenna 15 and coupled via line 41 (FIG. 1), the multiplexer 34, and the RF amplifier 36 to the spectrum analyzer 37 wherein the amplitude of the peak emanation at the selected frequency is determined and stored in the computer with frequencY, polarization, turn table angle position, and vertical angle labels. After these tasks have been completed the computer sends commands to rotate the calibrated antenna to be vertically polarized and adjust its height for the reception of the peak emanation for vertical polarization at the selected frequencY. With these parameters set, the measurements are repeated and the data stored. This procedure is repeated for each frequency of interest. After measurements have been made at all the frequencies of interest a report is printed and the DUT 13 is shut off. A program flow chart for implementing the above described measurement procedure is shown in FIG. 4.

I claim:

1. A peak radiated energy locator of the type including a turn table for mounting a device from which radiated energy is to be detected and a vertically positionable antenna for receiving radiated energy from the device comprising:

a mast removably positioned between said antenna and said device;

a plurality of broadband antennas positioned in vertical alignment on said mast;

means coupled to said plurality of broadband antennas for determining a vertical angle at which peak radiated energy from said device is detected and providing signals representative of said vertical angle; and means responsive to said vertical angle representative signals for vertically locating said vertically positionable antenna at a height determined from said vertical angle.

2. The peak energy locator of claim 1 further including:

a storage chamber below ground level and located between said turn table and said vertically positionable antenna; and means for positioning said mast in and out of said storage chamber.

3. The peak energy locator of claim 1 wherein said broadband antennas comprise horizontal and vertical sensitive elements.

4. The peak energy locator of claim 1 wherein said vertical angle means includes:

means coupled to said plurality of broadband antennas for providing signals representative of radiation received at each broad band antenna; and means responsive to said radiation representative signals for determining one of said plurality of broadband antennas at which a radiation level is received that exceeds radiation levels at all other broadband antennas, establishing a vertical angle determined from a height of said one broadband antenna, and providing said signals representative of said vertical angle.

5. The peak energy locator of claim 4 wherein said signals means includes:

means for sequentially sampling said plurality of broadband antennas to provide a sequence of sampled signals; and means coupled to said sampling means for determining levels of said sampled signals in said sequence and providing said representative radiation signals in accordance with to said levels.

6. The peak energy locator of claim 5 wherein said sampling means is a multiplexer and said levels means is a spectrum analyzer.

7. The peak energy locator of claim 5 further including:

a storage chamber below ground level and located between said turn table and said vertically positionable antenna; and means for positioning said mast in and out of said storage chamber.

8. The peak energy locator of claim 5 wherein said vertical angle means further determines a rotation angle of said turntable at which said peak radiated energy from said device occurs and provides a signal representative of said rotation angle, and further includes means responsive to said rotation angle representative signal for rotating said turn table to said rotation angle for said peak radiated energy.

9. A method for determining peak radiated energy from a device on a turn table, said radiated energy received by a vertically positionable antenna comprising the steps of:

mounting a plurality of broadband antennas on a movable mast;

positioning said movable mast between said device and said vertically positionable antenna:

determining a vertical angle of peak radiated energy from said device by comparing energy levels received at said plurality of broadband antennas;

removing said movable mast;

locating said vertically postionable antenna at a height determined from said vertical angle; and determining a level of said peak radiated energy.

10. The method of claim 9 wherein the step of determining said vertical angle of peak radiated energy includes the steps of;

determining a vertical angle of peak radiated energy for horizontal polarization; and determining a vertical angle of peak radiated energy for vertical polarization.

11. The method of claim 9 wherein the step of determining said vertical angle includes the steps of:

determining radiation levels at each of said broadband antennas; and comparing said radiation levels to establish at which of said plurality of broadband antennas said peak radiation level is received; and establishing a vertical angle determined vertical position on said mast of said broadband antennas at which said peak radiation level is received.

12. The method of claim 11 wherein the step of determining said radiation levels includes the steps of:

sampling said broadband antennas sequentially to obtain a sequence of sampled signals; and determining levels of signals in said sequence of sampled signals.

13. The method of claim 9 further including the steps of:

determining a rotation angle of said turn table at which said peak radiated energy occurs; and positioning said turn table to said rotation angle.

14. In apparatus for measuring the peak energy radiated by a device, said apparatus comprising a turn table for mounting said device and a vertically positionable antenna for receiving radiated energy from said device, the improvement comprising a mast removably positioned between said antenna and said device;

a plurality of sense antennas positioned on said mast for receiving radiated energy from said device and furnishing sensed signals in response thereto;

means responsive to said sensed signals for generating a desired height signal for said measuring antenna; and means for positioning said measuring antenna to a height signified by said desired height signal.

* * * * *